United States Patent
Miyazaki et al.

(10) Patent No.: US 7,459,031 B2
(45) Date of Patent: *Dec. 2, 2008

(54) METHOD FOR PRODUCING $Nb_3Sn$ SUPERCONDUCTIVE WIRE MATERIAL USING POWDER PROCESS

(75) Inventors: Takayoshi Miyazaki, Kobe (JP); Hiroyuki Kato, Kobe (JP); Kyoji Zaitsu, Kobe (JP); Kyoji Tachikawa, Hiratsuka (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/661,695

(22) PCT Filed: Sep. 12, 2005

(86) PCT No.: PCT/JP2005/016772

§ 371 (c)(1),
(2), (4) Date: Mar. 2, 2007

(87) PCT Pub. No.: WO2006/030744

PCT Pub. Date: Mar. 23, 2006

(65) Prior Publication Data

US 2008/0092992 A1     Apr. 24, 2008

(30) Foreign Application Priority Data

Sep. 15, 2004     (JP) .............................. 2004-268703

(51) Int. Cl.
*H01L 39/24*     (2006.01)
(52) U.S. Cl. .............................. 148/98; 419/34; 29/599
(58) Field of Classification Search ........................ None
See application file for complete search history.

(56) References Cited

U.S. PATENT DOCUMENTS

| 4,043,028 A | 8/1977 | Koike et al. |
| 2006/0216191 A1 * | 9/2006 | Miyazaki et al. ............... 419/8 |

FOREIGN PATENT DOCUMENTS

EP     1 750 287 A1     5/2005

(Continued)

OTHER PUBLICATIONS

International Search Report of PCT/JP2005/016772 mailed Dec. 20, 2005.

(Continued)

*Primary Examiner*—John P. Sheehan
(74) *Attorney, Agent, or Firm*—Reed Smith LLP; Stanley P. Fisher, Esq.; Juan Carlos A. Marquez, Esq.

(57) ABSTRACT

A method for producing an $Nb_3Sn$ superconductive wire material using a powder process is provided, in which a powdered raw material is filled in a sheath made of Nb or an Nb-based alloy, and the above sheath is subjected to diameter reduction to form a wire, followed by heat treatment to form a superconducting layer at the interface between the sheath and the filled powder. The above powdered raw material contains powdered Sn, powdered Cu, and a powdered alloy or a powdered intermetallic compound, which is formed from Sn and at least one metal selected from the group consisting of Ti, Zr, Hf, V, and Ta.

2 Claims, 1 Drawing Sheet

FOREIGN PATENT DOCUMENTS

| JP | 49-114389 | 2/1973 |
| JP | 52-16997 | 7/1975 |
| JP | 11-250749 | 3/1998 |

OTHER PUBLICATIONS

Extended European Search Report dated Jul. 9, 2008 regarding Application No. 05778559.4—2222 / 1796109 PCT/JP2005016772.

Tachikawa, K., et al., "High-Field Performance and Structure of $(Nb,Ta)_3Sn$ Superconductors Produced by Ta-Sn Core", IEEE Transactions on Applied Superconductivity, vol. 11, No. 1, Mar. 2001, pp. 3663-3666.

Tachikawa, K., et al., XP-002484133 "Optimization of Processing Parameter of $(Nb,Ta)_3Sn$ Superconductors with Ta-Sn Core", CP614, Advances in Cryogenic Engineering: Proceedings of the International Cryogenic Materials Conference—ICMC, vol. 48, © 2002, pp. 917-924.

* cited by examiner

FIGURE
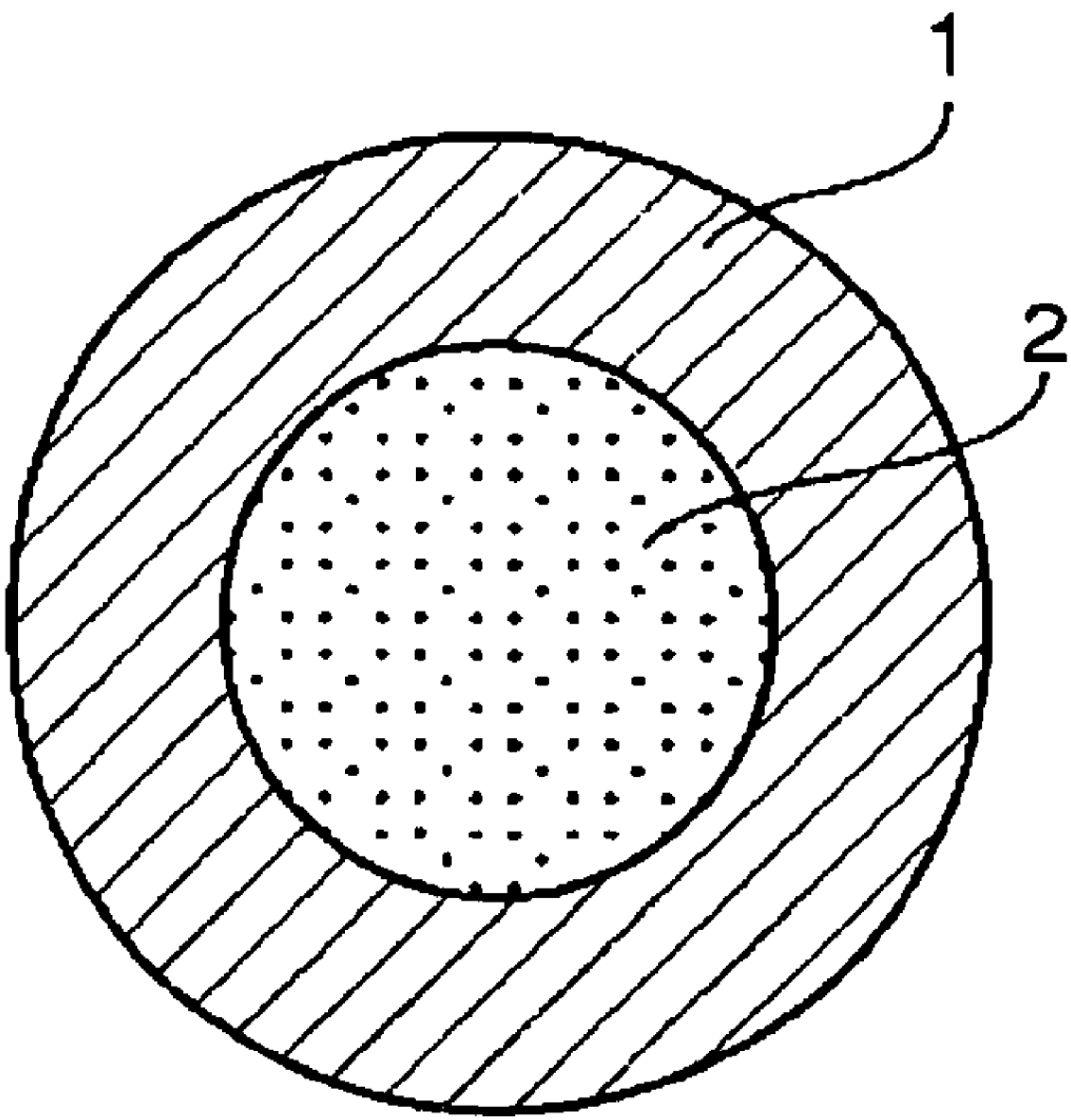

METHOD FOR PRODUCING NB₃SN SUPERCONDUCTIVE WIRE MATERIAL USING POWDER PROCESS

TECHNICAL FIELD

The present invention relates to a method for producing an Nb₃Sn superconductive wire material using a powder process, and more particularly, relates to a method for producing an Nb₃Sn superconductive wire material which is useful as a material for forming superconductive magnets used for high magnetic field generation.

BACKGROUND ART

Among the fields in which superconductive wire materials are practically used, since the resolution of a high resolution nuclear magnetic resonance (NMR) analyzer is enhanced when a superconductive magnet used therefor is improved to generate a higher magnetic field, in recent years, a superconductive magnet generating a higher magnetic field tends to be further pursued.

As a superconductive wire material for forming superconductive magnets used for high magnetic field generation, an Nb₃Sn wire material has been practically used, and for producing this Nb₃Sn superconductive wire material, a bronze process has been primarily used. In this bronze process, after a plurality of Nb-based cores is buried in a Cu—Sn-based alloy (bronze) matrix, wire drawing is performed, so that the Nb-based cores are formed into filaments. Subsequently, the filaments are bundled to form a wire material group and are then buried in copper (stabilizing copper) for stabilization, followed by wire drawing. Next, the above wire material group is heat-treated (diffusion heat treatment) at 600 to 800° C., so that an Nb₃Sn compound phase is formed at the interface between the Nb-based filaments and the matrix. However, since this process limits the Sn concentration solid-solved in bronze (15.8 mass percent or less), the thickness of the Nb₃Sn phase to be formed is small, and the crystallinity is degraded; hence, there has been a problem in that high magnetic field properties are not superior.

As a method for producing an Nb₃Sn superconductive wire material, besides the above bronze process, a tube process, and an internal diffusion process have also been known. In the tube process among those mentioned above, after an Sn core is disposed in an Nb tube, this tube is inserted in a Cu pipe and is then subjected to diameter reduction to form a wire, followed by heat treatment, so that Nb₃Sn is formed by diffusion reaction between Nb and Sn (for example, see Patent Document 1). In addition, in the internal diffusion process, after Cu is prepared as a mother material, an Sn core surrounded with Cu is buried in the central part of this mother material, and a plurality of Nb wires surrounded with Cu is disposed around the Sn core, so that a composite is formed. Subsequently, this composite is subjected to diameter reduction to form a wire, followed by heat treatment thereof; hence, Nb₃Sn is formed by reaction between Sn and Nb which are diffused in Cu (for example, see Patent Document 2). Unlike the bronze process, since these processes described above do not limit the Sn concentration which is solid-solved, the Sn concentration can be increased as desired, and hence the superconductive properties can be improved.

As a method for producing an Nb₃Sn superconductive wire material, a powder process has also been known. For example, a process has been disclosed in Patent Document 3 in which after melt diffusion reaction is performed at a high temperature between Sn and at least one metal (alloy element) selected from the group consisting of Ti, Zr, Hf, V, and Ta to form an alloy or intermetallic compound thereof (hereinafter referred to as an "Sn compound" in some cases), the Sn compound thus obtained is pulverized into a powdered Sn compound, which is one of powdered raw materials, this powdered raw material is loaded as a core material (powder core portion which will be described later) in an Nb sheath or an Nb-based alloy sheath, and this sheath is subjected to diameter reduction to form a wire, followed by heat treatment (diffusion heat treatment) of the wire. Since a high-quality Nb₃Sn phase having a thickness greater than that produced by the bronze process can be obtained by the process described above, it has been known that a superconductive wire material having superior high magnetic field properties can be obtained. In addition, by the process described above, it has also been shown that the Sn content in the powdered raw material can be increased to 20 to 75 atomic percent.

FIG. 1 is a cross-sectional view schematically showing the state in which an Nb₃Sn superconductive wire material is produced by a powder process, and reference numerals 1 and 2 in the FIGURE indicate a sheath (pipe member) made of Nb or an Nb-based alloy and a powder core portion in which a powdered raw material is loaded, respectively. When the powder process is carried out, after a powdered raw material containing at least Sn is loaded in the powder core portion 2 of the sheath 1, the sheath 1 is then extruded for diameter reduction, such as wire drawing, to form a wire, and the wire is then wound around a magnet or the like, followed by heat treatment, so that an Nb₃Sn superconductive layer is formed at the interface between the sheath and the powdered raw material.

As a heat treatment temperature for forming a superconductive layer, it has been believed that a high temperature of approximately 900 to 1,000° C. is preferable; however, it has also been known that when Cu is added to a powdered raw material, the heat treatment temperature can be decreased to approximately 650 to 750° C. From the point described above, in the powder process, after a small amount of powdered Cu is added to a powdered raw material, heat treatment is performed to produce an intermetallic compound, and in the tube process, a thin Cu layer is disposed inside the sheath. In FIG. 1, a single core is schematically shown by way of example; however, in practice, a multiple core material, which is formed of a Cu matrix and a plurality of single cores disposed therein, is generally used.

The superconductive wire material as described above is tightly wound to form a solenoid shape in many cases so as to be used as a high-magnetic-field superconductive magnet, and in order to prevent electrical short-circuiting in this type of tightly wound magnet, wiring is generally performed after an insulating material formed of glass fibers is disposed around the periphery of the wire material. In addition, beside a wire material having a circular cross-sectional shape, a wire material having a rectangular cross-sectional shape may also be used. In addition, since an Nb₃Sn phase is very fragile, after the winding around a magnet or the like is performed, it is designed to perform heat treatment to produce an Nb₃Sn phase (wind and react method (W&R method)).

As described above, it has been believed that the heat treatment temperature (diffusion heat treatment temperature) for forming a superconductive layer is preferably a high temperature of approximately 900 to 1,000° C. However, by the heat treatment at a high temperature as described above, glass fibers as an insulating material is embrittled, and after the heat treatment, sufficient insulating properties cannot be ensured. On the other hand, when the heat treatment temperature is decreased to approximately 750° C., diffusion of Sn from an Sn compound and reaction between Sn and Nb become insufficient, and as a result, superconductive properties (such as critical current density Jc) are disadvantageously degraded.

In addition, as described above, it has also been known that by addition of Cu to a powdered raw material, the heat treatment temperature can be decreased to 750° C. or less. However, when the configuration as described above is used, besides Sn and at least one powdered metal selected from the group consisting of Ti, Zr, Hf, V, and Ta, individual powders of Cu are each further weighed in an appropriate amount and are mixed together, and heat treatment is then performed, followed by a pulverization step. Hence, when the powder process is performed using a powdered raw material obtained by the steps described above, a very hard Cu—Sn compound is simultaneously produced in the heat treatment. The presence of this produced Cu—Sn compound causes abnormal deformation of the sheath during a diameter reduction step, and wire breakage may occur thereby in the worst case.

Furthermore, when a powdered raw material is loaded in a sheath material, a uniaxial press is generally used; however, instead of the treatment as described above, powder compaction by an isotropic pressure, such as a cold isostatic press method (CIP method), is preferably performed since the filling rate of the powdered raw material can be increased, and uniform processing can also be performed. However, when the CIP method is applied to the above powdered Sn compound, since the compound itself has inferior ductility, non-uniform deformation may occur conversely in a subsequent wire-drawing step, and as a result, a problem may arise in that production of a superconductive wire material itself becomes difficult.

Patent Document 1: Claims etc. of Japanese Unexamined Patent Application Publication No. 52-16997

Patent Document 2: Claims etc. of Japanese Unexamined Patent Application Publication No. 49-114389

Patent Document 3: Japanese Unexamined Patent Application Publication No. 11-250749

DISCLOSURE OF INVENTION

The present invention has been conceived under the above circumstances, and an object of the present invention is to provides a useful method for producing an $Nb_3Sn$ superconductive wire material using a powder process, in which uniform processing can be performed without causing any wire breakage and the like during production, and superior superconductive properties can be obtained even when heat treatment is performed at a relatively low temperature.

The method according to the present invention, which can achieve the above object, is a method for producing an $Nb_3Sn$ superconductive wire material using a powder process, which comprises: filling a powdered raw material in a sheath made of Nb or an Nb-based alloy, subjecting the sheath to diameter reduction to form a wire, and performing heat treatment for the wire to form a superconductive wire layer at the interface between the sheath and the filled powder. The powdered raw material described above contains powdered Sn, powdered Cu, and a powdered alloy or a powdered intermetallic compound, which is formed from Sn and at least one metal selected from the group consisting of Ti, Zr, Hf, V, and Ta.

BRIEF DESCRIPTION OF THE DRAWINGS

FIG. 1 is a cross-sectional view schematically showing an $Nb_3Sn$ wire material obtained by a powder process.

BEST MODE FOR CARRYING OUT THE INVENTION

According to the present invention, the above object can be achieved when powdered Sn, powdered Cu, and a powdered Sn compound are used as a powdered raw material when an $Nb_3Sn$ superconductive wire material is produced by a powder process, the Sn compound being formed beforehand by reaction (melt diffusion reaction) between Sn and at least one metal (alloy element) selected from the group consisting of Ti, Zr, Hf, V, and Ta, followed by pulverization.

The powdered Sn compound of the powdered raw material used in the present invention contains at least one metal (alloy element) selected from the group consisting of Ti, Zr, Hf, V, and Ta, and when a small amount of the above metal is solid-solved in a reaction phase in $Nb_3Sn$ production, an effect of improving superconductive properties can be obtained. In addition, since the above metal forms a high-melting-point Sn compound, an effect of preventing Sn from being solved out by a process temperature in extrusion can also be obtained. That is, since an Sn element has a low melting point, Sn is solved out by a process temperature in extrusion of a sheath filled with an Sn element; however, when Sn is alloyed beforehand, the inconvenience as described above can be avoided. In order to obtain the above effects, it is necessary to form an alloy or an intermetallic compound of Sn beforehand by melt diffusion reaction between Sn and the above metal. In addition, in order to obtain the above effects, in a conventional production method, the amount of Sn to be contained in a powdered raw material is all added when melt diffusion reaction is performed. Furthermore, in order to obtain good pulverization properties of a compound obtained by melt diffusion reaction, Cu used for decreasing heat-treatment reaction temperature is also added and mixed when the melt diffusion reaction is performed.

However, when the conventional method as described above is used, a Cu—Sn compound which has adverse influence on machinability is formed as described above. In addition, since adhesion and machinability of a powdered raw material are degraded, and powder compaction by isotropic pressure, such as CIP, cannot be preferably performed.

The present invention realizes an $Nb_3Sn$ superconductive wire material having superior superconductive properties while the above inconveniences are prevented. That is, it was found that when the melt diffusion reaction is performed, instead of allowing all the Sn amount of the powdered raw material, which is necessary in a final product, that is, a superconductive wire material, to react, a minimum necessary amount of Sn to form an alloy with at least one metal selected from the group consisting of Ti, Zr, Hf, V, and Ta may be added for reaction. In addition, it was also found that instead of adding Cu in the melt diffusion reaction, when Cu is added as a powder raw material to the powdered Sn compound obtained by the above reaction and is then mixed, the effect of decreasing a heat treatment temperature by Cu addition can also be effectively obtained. Furthermore, by the production method according to the present invention, the Sn amount effectively used in the powdered raw material can be increased, and even when the heat treatment temperature is set to 750° C. or less, an $Nb_3Sn$ superconductive wire material having a high critical current density can be realized, so that the superconductive properties are further improved.

In addition, according to the present invention, since the powdered Cu is added after the powdered Sn compound is formed beforehand, wire formation can be performed without forming a Cu—Sn alloy having a high hardness in Sn compound-production reaction (melt diffusion reaction), and hence generation of abnormal deformation and wire breakage during wire material processing can be reduced as small as possible.

The above powdered Sn compound can be obtained by melt diffusion reaction between Sn and at least one metal selected from the group consisting of Ti, Zr, Hf, V, and Ta. The mixing ratio between the metal and Sn is not particularly limited; however, in view of superconductive properties, the ratio of the metal to Sn is preferably in the range of approximately 4:1 to 1:2 (atomic ratio).

In the present invention, an Sn compound is formed and is then pulverized, so that the powdered Sn compound is prepared, and a mixture formed by mixing following the addition of the powdered Sn and the powdered Cu to the above powdered Sn compound is used as the powdered raw material. As the mixing ratio of the powdered Sn and the powdered Cu in the powdered raw material, when the amount of the powdered Sn compound is assumed to be 100, the amounts of the powdered Sn and the powdered Cu are preferably in the ranges of 15 to 90 mass percent and 1 to 20 mass percent, respectively.

When the mixing ratio of the powdered Sn is less than 15 mass percent, the effect of improving superconductive properties by addition of Sn tends to be difficult to obtain, and when the above ratio is more than 90 mass percent, since the content of the alloy element in the powdered raw material is relatively decreased, Sn is liable to be solved out by a process temperature generated in extrusion. In addition, when the mixing ratio of the powdered Cu is less than one mass percent, the effect of decreasing heat treatment temperature (diffusion heat treatment temperature) by addition of Cu tends to be difficult to obtain, and when the above ratio is more than 20 mass percent, since Cu is liable to be diffused to an $Nb_3Sn$ phase in the diffusion heat treatment, an $Nb_3Sn$ phase having superior quality is difficult to obtain, so that a critical current density Jc is liable to decrease.

In the method according to the present invention, before the powdered raw material is filled in the sheath, it is also effective to perform powder compaction by an isotropic pressure for the powdered raw material using a cold isostatic pressing method (CIP method) or the like. By performing the powder compaction as described above for the powdered raw material, the filling rate of the powdered raw material in the sheath can be increased to 95% or more. In addition, since the powdered raw material used in the present invention is composed of the powdered Sn compound and the powdered Sn added thereto and mixed therewith, compared to the case in which the powder compaction is performed only for the powdered Sn compound, uniform processing can be performed since the powdered Sn functions as a deformation medium.

When CIP is performed for the powdered raw material in the present invention, powder compaction is performed after the powdered raw material is filled in a rubber mold. Hence, a CIP molded member thus obtained can be machined, and only by this machinability, billet assembly accuracy can be improved. In addition, as the conditions for performing CIP, in order to fill a powder at a higher density, the pressure is preferably set to 10 MPa or more. In addition, a pressure application pattern is not particularly limited; however, the pressure may be increased from a low pressure in a stepwise manner. In addition, when heating is performed at approximately 300° C. after the powdered Sn is added in CIP, the Sn is well blended with other ingredients, and hence the machinability is preferably improved.

Hereinafter, the present invention will be described in more detail with reference to an example; however, the present invention is not limited to the example below, and any modifications without departing from the scope described in this specification are to be included in the technical range of the present invention. For example, in the following example, the case in which a single core superconductive wire material is used will be described; however, of course, the present invention may also be applied to the case in which a multicore superconductive wire material is used which is composed of a plurality of single cores disposed in a Cu matrix.

EXAMPLE 1

In an Ar gas atmosphere, powdered Ta and powdered Sn, each having a grain diameter passing through 350 mesh, were weighed by an electronic balance so that the ratio of Ta to Sn was 6 to 5 (atomic ratio). Those powdered materials were mixed together by a V-blender for 30 minutes. This mixed powder was heat-treated at 950° C. for 10 hours under a vacuum condition, so that a Ta—Sn compound was formed. In addition, as for powder No. 1 shown in the following Table 1, two mass percent of powdered Cu was further added at the stage of the above mixed powder.

After the Ta—Sn compound thus obtained was coarsely pulverized, it was further pulverized for one hour in an Ar atmosphere using an automatic mortar mixer, so that a powdered Ta—Sn compound having a grain diameter of 75 µm or less was obtained. The powder thus obtained is listed in Table 1 as the "powdered Sn compound".

To the powdered Sn compound obtained as described above powdered Sn and powdered Cu, in an amount shown in the following Table 1 with respect to an amount of 100 of the powdered Sn compound, were added in an Ar atmosphere, followed by mixing using a V-blender for one hour. After a mixed powder thus formed was filled in a rubber mold and was then sealed, compression was performed at 200 MPa for 15 minutes by CIP, thereby forming a molded member having a diameter of 32 mm and a length of 181 mm.

After the molded member thus obtained was machined into a rod having a diameter of 30 mm and a length of 180 mm and was then inserted into a Ta alloy-made sheath containing 7.5 mass percent of Nb, which had an outer diameter of 50 mm and an inner diameter of 30 mm, the sheath thus prepared was further inserted into an extrusion billet made of oxygen-free copper having an outer diameter of 65 mm and an inner diameter of 55 mm. This extrusion billet was extruded by a hydrostatic extrusion machine and was then further processed by die wire drawing to form a wire having a diameter of 0.2 mm.

This workpiece was heat-treated to produce $Nb_3Sn$ at 700° C. for 100 hours under a vacuum condition. This heat-treated wire was placed in a superconductive magnet and was applied with an external magnetic field, so that the critical current (Ic) was measured. The Ic was divided by a non-copper area of a wire cross-section to obtain the critical current density (Jc), so that evaluation was performed thereby. The critical current densities (Jc) of individual wire materials obtained at a temperature of 4.2K and a magnetic field of 20 T are also shown in the following Table 1.

TABLE 1

| No. | Composition of Powdered Sn Compound | Addition Amount of Powdered Sn (mass %) | Addition Amount of Powdered Cu (mass %) | Result of Extrusion | Wire Drawing | Critical Current Density Jc (A/mm$^2$) |
|---|---|---|---|---|---|---|
| 1 | Ta:Sn = 6:5(atomic ratio) + addition of 2 mass % of powdered Cu | 0 | 0 | normal | wire partly broken | 30 |
| 2 | Ta:Sn = 6:5(atomic ratio) | 5 | 0.5 | normal | Nonuniformly deformed | 29 |
| 3 | Ta:Sn = 6:5(atomic ratio) | 5 | 2 | normal | Nonuniformly deformed | 40 |
| 4 | Ta:Sn = 6:5(atomic ratio) | 5 | 30 | normal | Nonuniformly deformed | 51 |
| 5 | Ta:Sn = 6:5(atomic ratio) | 20 | 0.5 | normal | normal | 92 |
| 6 | Ta:Sn = 6:5(atomic ratio) | 20 | 35 | normal | normal | 105 |
| 7 | Ta:Sn = 6:5(atomic ratio) | 95 | 0.5 | Sn solved out | — | — |
| 8 | Ta:Sn = 6:5(atomic ratio) | 95 | 10 | Sn solved out | — | — |
| 9 | Ta:Sn = 6:5(atomic ratio) | 95 | 35 | Sn solved out | — | — |
| 10 | Ta:Sn = 6:5(atomic ratio) | 15 | 1 | normal | normal | 290 |
| 11 | Ta:Sn = 6:5(atomic ratio) | 15 | 10 | normal | normal | 320 |
| 12 | Ta:Sn = 6:5(atomic ratio) | 15 | 20 | normal | normal | 305 |
| 13 | Ta:Sn = 6:5(atomic ratio) | 50 | 1 | normal | normal | 294 |
| 14 | Ta:Sn = 6:5(atomic ratio) | 50 | 10 | normal | normal | 382 |
| 15 | Ta:Sn = 6:5(atomic ratio) | 50 | 20 | normal | normal | 356 |
| 16 | Ta:Sn = 6:5(atomic ratio) | 90 | 1 | normal | normal | 320 |
| 17 | Ta:Sn = 6:5(atomic ratio) | 90 | 10 | normal | normal | 398 |
| 18 | Ta:Sn = 6:5(atomic ratio) | 90 | 20 | normal | normal | 412 |

As can be seen from the above results, it is found that the Nb$_3$Sn superconductive wire materials produced in accordance with the procedure according to the present invention all show superior superconductive properties.

As has thus been described, according to the method of the present invention, when a mixed powder containing powdered Sn, powdered Cu, and a powdered Sn compound is used as a powdered raw material, the powdered Sn compound being formed beforehand by reaction (melt diffusion reaction) between Sn and at least one metal (alloy element) selected from the group consisting of Ti, Zr, Hf, V, and Ta, the amount of Sn which contributes to an Nb$_3$Sn phase production reaction can be increased, and in addition, even when the production heat treatment temperature is 750° C. or less, a sufficient amount of a uniform superconductive layer can be obtained. As a result, an Nb$_3$Sn superconductive wire material having a high critical current density can be realized. In addition, since the powdered Cu is added to the powdered Sn compound formed beforehand, when Sn compound production reaction (melt diffusion reaction) is performed, a Cu—Sn compound having a high hardness is not produced. Accordingly, when the diameter of the sheath is reduced, generation of abnormal deformation and wire breakage can be reduced as small as possible.

In addition, when the method according to the present invention is performed, the amounts of the powdered Sn and the powdered Cu contained in the powdered raw material are preferably set in the ranges of 15 to 90 mass percent and 1 to 20 mass percent, respectively, with respect to an amount of 100 of the powdered Sn compound.

Furthermore, when the method according to the present invention is performed, powder compaction by an isotropic pressure is preferably performed before the powdered raw material is filled in the sheath.

The present application claims priority based on Japanese Patent Application No. 2004-268703, filed on Sep. 15, 2004, the disclosure of which is hereby incorporated by reference.

The invention claimed is:

1. A method for producing an Nb$_3$Sn superconductive wire material using a powder process, comprising: filling a powdered raw material in a sheath made of Nb or an Nb-based alloy, subjecting the sheath to diameter reduction to form a wire, and performing heat treatment for the wire to form a superconductive layer at the interface between the sheath and the filled powder,
   wherein the powdered raw material contains powdered Sn, powdered Cu, and a powdered alloy or powdered intermetallic compound, which is formed from Sn and at least one metal selected from the group consisting of Ti, Zr, Hf, V, and Ta, respectively, and
   when the amount of the powdered alloy or the powdered intermetallic compound is assumed to be 100, the amounts of the powdered Sn and the powdered Cu in the powdered raw material are 15 to 90 mass percent and 1 to 20 mass percent, respectively.

2. The method for producing an Nb$_3$Sn superconductive wire material using a powder process, according to claim 1, further comprising:
   performing powder compaction of the powdered raw material by an isotropic pressure before the powdered raw material is filled in the sheath.

* * * * *